United States Patent
Vallauri

(10) Patent No.: US 10,401,387 B2
(45) Date of Patent: Sep. 3, 2019

(54) MANUFACTURING METHOD OF CONTACT PROBES FOR A TESTING HEAD

(71) Applicant: Technoprobe S.p.A., Cernusco Lombardone (IT)

(72) Inventor: Raffaele Ubaldo Vallauri, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 40 days.

(21) Appl. No.: 15/640,159

(22) Filed: Jun. 30, 2017

(65) Prior Publication Data

US 2017/0307656 A1  Oct. 26, 2017

Related U.S. Application Data

(63) Continuation-in-part of application No. PCT/EP2015/081327, filed on Dec. 29, 2015.

(30) Foreign Application Priority Data

Dec. 30, 2014 (IT) .............................. MI2014A2288

(51) Int. Cl.
   *G01R 31/00* (2006.01)
   *G01R 1/067* (2006.01)
   (Continued)

(52) U.S. Cl.
   CPC .......... *G01R 1/06744* (2013.01); *B23K 26/38* (2013.01); *B44C 1/22* (2013.01);
   (Continued)

(58) Field of Classification Search
   CPC ............ G01R 1/07307; G01R 1/07342; G01R 1/0408; G01R 1/0433; G01R 1/0483; G01R 1/07314; G01R 31/26; G01R 31/2808; G01R 31/2886
   (Continued)

(56) References Cited

U.S. PATENT DOCUMENTS

2002/0066063 A1* 5/2002 Saunders ........... G01R 1/06772
                                                                438/18
2006/0022686 A1   2/2006 Fan et al.
   (Continued)

FOREIGN PATENT DOCUMENTS

| JP | 2010-071646 A | † | 4/2010 |
| JP | 2010-117268 A | † | 5/2010 |
| WO | 2013/101240 A1 | † | 7/2013 |

*Primary Examiner* — Huy Q Phan
*Assistant Examiner* — Raul J Rios Russo
(74) *Attorney, Agent, or Firm* — Seed IP Law Group LLP

(57) ABSTRACT

A manufacturing method of contact probes for a testing head comprises the steps of: providing a substrate made of a conductive material; and defining at least one contact probe by laser cutting the substrate. The method further includes at least one post-processing fine definition step of at least one end portion of the contact probe, that follows the step of defining the contact probe by laser cutting, the end portion being a portion including a contact tip or a contact head of the contact probe. The fine definition step does not involve a laser processing and includes geometrically defining the end portion of the contact probe with at least a substantially micrometric precision.

28 Claims, 10 Drawing Sheets

(51) Int. Cl.
*G01R 1/073* (2006.01)
*G01R 1/04* (2006.01)
*G01R 3/00* (2006.01)
*B23K 26/38* (2014.01)
*B44C 1/22* (2006.01)
*B23K 101/38* (2006.01)

(52) U.S. Cl.
CPC ......... *G01R 1/0408* (2013.01); *G01R 1/0433* (2013.01); *G01R 1/07307* (2013.01); *G01R 1/07314* (2013.01); *G01R 1/07342* (2013.01); *G01R 1/07364* (2013.01); *G01R 3/00* (2013.01); *B23K 2101/38* (2018.08); *G01R 1/07371* (2013.01)

(58) Field of Classification Search
USPC ......... 324/71, 378, 403, 415, 425, 500, 537, 324/756.01, 756.03
See application file for complete search history.

(56) References Cited

U.S. PATENT DOCUMENTS

| | | |
|---|---|---|
| 2006/0066328 A1 | 3/2006 | Clegg et al. |
| 2006/0119376 A1 | 6/2006 | Tunaboylu et al. |
| 2009/0115439 A1* | 5/2009 | Saunders ............ G01R 1/06772 324/750.01 |
| 2011/0035932 A1* | 2/2011 | Swift ................. G01R 1/06755 29/593 |
| 2012/0187970 A1* | 7/2012 | Saunders ............ G01R 1/06772 324/755.1 |
| 2012/0286816 A1 | 11/2012 | Kister |
| 2014/0044985 A1 | 2/2014 | Kister |
| 2014/0197145 A1† | 7/2014 | Veeramani |
| 2015/0008950 A1 | 1/2015 | Swart et al. |
| 2017/0122980 A1* | 5/2017 | Crippa ............... G01R 1/06755 |
| 2017/0299634 A1* | 10/2017 | Crippa ............... G01R 1/06761 |

\* cited by examiner
† cited by third party

MANUFACTURING METHOD OF CONTACT PROBES FOR A TESTING HEAD

BACKGROUND

Technical Field

In its more general aspect, the present disclosure refers to a manufacturing method of contact probes for a testing head and the following description is carried out with reference to this application field with the only purpose to simplify its exposition.

Description of the Related Art

As it is well known, a testing head (probe head) is essentially a device suitable to place a plurality of contact pads of a microstructure, in particular an electronic device that is integrated on a wafer, into electrical contact with corresponding channels of a testing machine performing the working test thereof, in particular the electrical one, or generically the test.

The test, which is performed on integrated devices, is particularly useful to detect and isolate defective devices yet in the manufacturing step. Therefore, the testing heads usually are used to electrically test the devices that are integrated on a wafer before cutting (singling) and assembly them inside a chip package.

A testing head usually includes a high number of contact elements or contact probes made of special alloys having good mechanical and electrical properties and being provided with at least one contact portion for a corresponding plurality of contact pads of a device under test.

A testing head comprising vertical probes, which is usually called "vertical probe head", essentially includes a plurality of contact probes held by at least one pair of plates or guides, which are substantially plate-shaped and parallel to each other. Those guides are provided with specific holes and are arranged at a certain distance from each other in order to leave a free space or air gap for the movement and possible deformation of the contact probes. The pair of guides in particular include an upper guide and a lower guide, both provided with respective guide holes where the contact probes axially slide, the probes being usually made of special alloys having good electrical and mechanical properties.

The good connection between contact probes and contact pads of the device under test is guaranteed by pressing the testing head on the device itself, the contact probes, which are movable inside the guide holes made in the upper and lower guides, undergoing a bending inside the air gap between the two guides and a sliding inside those guide holes during that pressing contact.

Moreover, the contact probes bending in the air gap can be assisted by means of a suitable configuration of the probes themselves or of their guides, as schematically shown in FIG. 1, where, for sake of illustration simplicity, only one contact probe of the plurality of probes usually included in a testing head has been depicted, the shown testing head being of the so-called shifted plates type.

In particular, in FIG. 1 a testing head 1 is schematically shown comprising at least one upper plate or guide 2 and one lower plate or guide 3, having respective upper guide hole 2A and lower guide hole 3A where at least one contact probe 4 slides.

The contact probe 4 has at least one contact end or tip 4A. Here and in the following, the terms end or tip mean an end portion, not necessarily being sharp. In particular the contact tip 4A abuts on a contact pad 5A of a device under test 5, realizing the electrical and mechanical contact between that device and a testing apparatus (not shown), the testing head 1 forming a terminal element thereof.

In some cases, the contact probes are fixedly fastened to the testing head at the upper guide: in such a case, the testing heads are referred to as blocked probe testing heads.

Alternatively, testing heads are used having probes not fixedly fastened, but being interfaced to a board by means of a micro contact board: in such a case, those testing heads are referred to as non-blocked probe testing heads. The micro contact board is usually called "space transformer" because, besides contacting the probes, it also allows spatially redistributing the contact pads made on it with respect to the contact pads of the device under test, in particular relaxing the distance constraints between the center of the pads themselves, namely with a space transformation in terms of distances between the adjacent pad centers.

In this case, as shown in FIG. 1, the contact probe 4 has a further contact tip 4B, which in this technical field is indicated as contact head, towards a plurality of contact pads 6A of that space transformer 6. The good electrical contact between probes and space transformer is guaranteed similarly to the contact with the device under test 5 by pressing the contact heads 4B of the contact probes 4 against the contact pads 6A of the space transformer 6.

As already explained, the upper 2 and lower 3 guides are suitably separated by an air gap 7 allowing the deformation of the contact probes 4 during the operation of the testing head 1 and guaranteeing that contact tip and contact head 4A and 4B of the contact probes 4 are contacting the contact pads 5A and 6A of the device under test 5 and space transformer 6, respectively. Clearly, the upper 2A and lower 3A guide holes must be sized in order to allow the contact probe 4 sliding therein.

It is known to realize a contact probe 4 by means of a body substantially extended in a longitudinal direction and made of a first conductive material, preferably a metal or a metal alloy, in particular a NiMn or NiCo alloy.

Therefore, the contact probes 4 are arranged inside the testing head 1 with the longitudinal direction being substantially vertically arranged, i.e. perpendicularly to the device under test and to the guides.

Sometimes it is suitable to subject the contact probes to operations, which are often complex and affect all the probes and the probes should be placed and held to a dedicated support usually called processing frame. Then, it is clearly necessary to remove the contact probes from the processing frame, in order to later proceed with their placement in a testing head.

The involved dimensions make the placing and holding operations of the contact probes to processing frame, and also their following removal, complicated and expensive, especially in terms of manufacturing times and wastes. Then, the same problems are found when placing the contact probes in the final testing head.

Moreover, those dimensions are extremely limiting for the manufacturing methods of the contact probes. In particular, in the field of the testing of the latest manufactured integrated circuits, the extremely reduced distance between the contact pads of the devices under test and consequently between the contact probes of the related testing heads hardly challenged the dimensional limits of the traditional manufacturing methods of the contact probes, which in particular use photolithographic, masking, growing and etching techniques.

Therefore, in the last years, the interest for manufacturing methods of contact probes for testing heads using the laser technology is increased.

For example, it is known from the PCT Patent Publication No. WO 2013/101240 to realize contact probes by means of laser cutting a substrate made of a conductive material. In particular, in the method disclosed in that patent application, a laser beam cuts the substrate by following a predetermined profile that corresponds to a contact probe and, in a further step, sharp edges formed on the contact probes can be smoothed by means of different operations.

Moreover, US Patent Publication No. 2014/0197145 discloses a manufacturing method of contact probes wherein a laser beam cuts a first layer, which is made of a conductive material, and a second layer, which is located on the backside of the first layer. In particular, the laser beam completely cuts the first conductive layer by following a path according to a contact probe profile, while the second layer is not cut completely, so as to provide a base or bridge that allows the realized contact probes to be connected thereto before that second layer is removed for example by chemical etching.

Furthermore, US Patent Publication No. 2012/0286816 discloses a contact probe that is manufactured by means of a laser cutting process, using a nanosecond or picosecond laser that cuts a substrate which is elevated above a surface such that there is nothing underneath that substrate. The laser cutting process also allows sculpting the probe surface, realizing for example three-dimensional features such as skates.

However, it has been proved that those laser techniques, in particular the laser cutting techniques that allow obtaining contact probes by "cutting out" a starting metal sheet by following a profile corresponding to the desired final shape for the probes, do not allow obtaining the suitable dimensional precision for that probes, in particular for the end portions, with the greatest difficulties for the related contact tips.

Therefore, it is known from the US Patent Publication No. 2014/0044985 in the name of FormFactor, Inc. to realize in advance those contact tips, in particular by means of sophisticated and accurate photolithographic techniques, in an edge portion of a metal sheet, then realizing the contact probes by laser cutting that sheet starting exactly from the already obtained tips.

However, the method described in that patent application is extremely complex, from one side due to the precision required to the photolithographic technique used to realize the contact tips and from the other side due to the alignment precision required to the laser cutting of the probes starting from those contact tips already realized by photolithography.

BRIEF SUMMARY

An embodiment of the disclosure is directed to a manufacturing method of a contact probe for testing heads, the probes being suitably realized in a metal substrate by laser cutting, the method having such characteristics to allow realizing contact probes in a simple, reliable and highly repeatable manner with the required dimensional precisions for the different probe portions and in particular for the end portions, in that way overcoming the limitations and drawbacks currently affecting the methods carried out according to the prior art.

The manufacturing method realizes the contact probes by laser cutting a conductive substrate and then to subject their end portions to post-processing operations in order to "fine" define that portions, namely obtaining dimensional precisions comparable to those obtained using more complex photolithographic definition techniques, those post-processing operations for the "fine" definition of the end portions being adapted to be repeated during the life of the contact probes, in particular also when they are already assembled in the corresponding testing heads.

According to an aspect of the disclosure, the manufacturing method of contact probes for a testing head comprises the steps of:
providing a substrate made of a conductive material; and
defining at least one contact probe by laser cutting the substrate;
the method further including at least one post-processing fine definition step of at least one end portion of the contact probe, that follows the step of defining the contact probe by laser cutting, the end portion being a portion including a contact tip or a contact head of the contact probe,
the fine definition step not involving a laser processing and geometrically defining the end portion of the contact probe with at least a substantially micrometric precision.

According to another aspect of the disclosure, the fine definition step can be simultaneously carried out onto a plurality of contact probes formed in the substrate by means of the step of defining by laser cutting.

The manufacturing method can further include a step of assembling the plurality of contact probes in a processing frame or in a real testing head so as to allow the displacement and manipulation thereof as a group.

According to another aspect of the disclosure, the fine definition step can include a micromechanical definition step of the end portion.

In particular, the micromechanical definition step can include a pressing contact onto an abrasive cloth of the end portion.

Alternatively, according to another aspect of the disclosure, the fine definition step can include a chemical or electrochemical process.

In particular, the chemical or electrochemical process can include an immersion of the end portion in a chemical agent up to a level, that chemical agent being adapted to etch the end portion, in case with a simultaneous passage of current.

More in particular, the immersion can include a variation of the chemical agent level in order to obtain a desired shape of the end portion and the variation of the chemical agent level can be obtained by a movement of the contact probes with respect to a bath containing the chemical agent, using driving means associated to a supporting frame or to a testing head housing the contact probes or to the bath including the chemical agent, or to a semi-finished product including the contact probes, or yet by means of an oscillating mass apt to penetrate in the bath or by means of a variation of the bath volume leading to a resulting variation of the chemical agent level.

According to another aspect of the disclosure, the fine definition step can include a re-shape and/or cleaning of the end portion.

Furthermore, according to another aspect of the disclosure, the step of defining by laser cutting can realize each contact probe so as to be anchored to the substrate by at least one bridge of material, the method comprising a further step of separation of each contact probe from the substrate by breaking and removing the bridge of material.

In particular, the at least one bridge of material can be realized in correspondence of an end portion of the contact probe and the fine definition step of the end portion allows to eliminate any imperfections due to the breakage and removal of the bridge of material.

According to another aspect of the disclosure, the fine definition step can be simultaneously carried out onto a plurality of contact probes anchored to the substrate prior to the further step of separation of each contact probe from the substrate.

The manufacturing method can further include a step of cutting the substrate in portions not belonging to the contact probes and not comprising the bridges of material such that the contact probes protrude from the substrate in correspondence of at least one end portion.

According to another aspect of the disclosure, the manufacturing method can further include a step of shortening the end portion of each contact probe preceding the fine definition step.

In particular, the step of shortening can include a lapping of the end portion; moreover, the step of shortening can affect a plurality of contact probes assembled on a processing frame or on a testing head obtaining respective end portions all having the same length.

According to another aspect of the disclosure, the fine definition step can be repeated for a plurality of contact probes assembled in a testing head during the life thereof, in case preceded by a step of shortening respective end portions.

Further, the step of laser defining each contact probe can include a definition of respective end portions including a contact tip and a contact head of the contact probe.

Finally, the step of laser defining can realize a plurality of contact probes in the substrate, the contact probes having corresponding end portions put side-by-side or alternating according to a transversal direction of the substrate.

The disclosure also refers to a planarization method of a testing head provided with at least one upper guide and one lower guide and comprising a plurality of contact probes, the guides having respective upper and lower guide holes, each contact probe sliding theretrough, the method comprising the steps of:
 shortening at least one end portion of each contact probe which protrudes with respect to the lower guide in a plane substantially parallel to a plane of a device to be tested by means of the testing head; and
 fine defining the at least one end portion of each contact probe,
 the fine definition step not involving a laser processing and geometrically defining the end portion of the contact probe with at least a substantially micrometric precision, so obtaining a testing head with contact probes having end portions all of a same length and geometrically defined with at least a substantially micrometric precision.

According to another aspect of the disclosure, the fine definition step can include a micromechanical definition step of the end portion, preferably a micromechanical definition including a pressing contact on an abrasive cloth or a chemical or electrochemical process, preferably including an immersion of the end portion in a chemical agent up to a level, the chemical agent being adapted to etch the end portion, in case with simultaneous current passage, that level being variable.

Moreover, the fine definition step can include a re-shape and/or cleaning of the end portion.

Finally, according to another aspect of the disclosure, the step of shortening can include a lapping of the end portion.

According to a further aspect of the disclosure, the manufacturing method of contact probes for a testing head comprises the steps of:
 providing a substrate made of a conductive material;
 laser cutting a plurality of contact probes in the substrate; and
 assembling the plurality of contact probes in a processing frame or in a testing head so as to allow the displacement and manipulation thereof as a group; and
 at least one post-processing fine definition step of at least one end portion of the contact probe, which follows the steps of laser cutting and assembling the contact probes and is simultaneously carried out onto the plurality of contact probes,
 the end portion being a portion including a contact tip or a contact head of the contact probe, and
 the post-processing fine definition step not involving a laser processing and further including:
  a micromechanical definition step comprising a pressing contact onto an abrasive cloth of the end portion of the contact probes assembled in the processing frame or in the testing head, so geometrically defining the end portion of the contact probe with at least a substantially micrometric precision less than 10 µm.

The characteristics and advantages of the manufacturing and planarization method according to the disclosure will result from the following description of one embodiment thereof, given by way of an indicative and non-limiting example with reference to the attached drawings.

DETAILED DESCRIPTION

Figure 1:
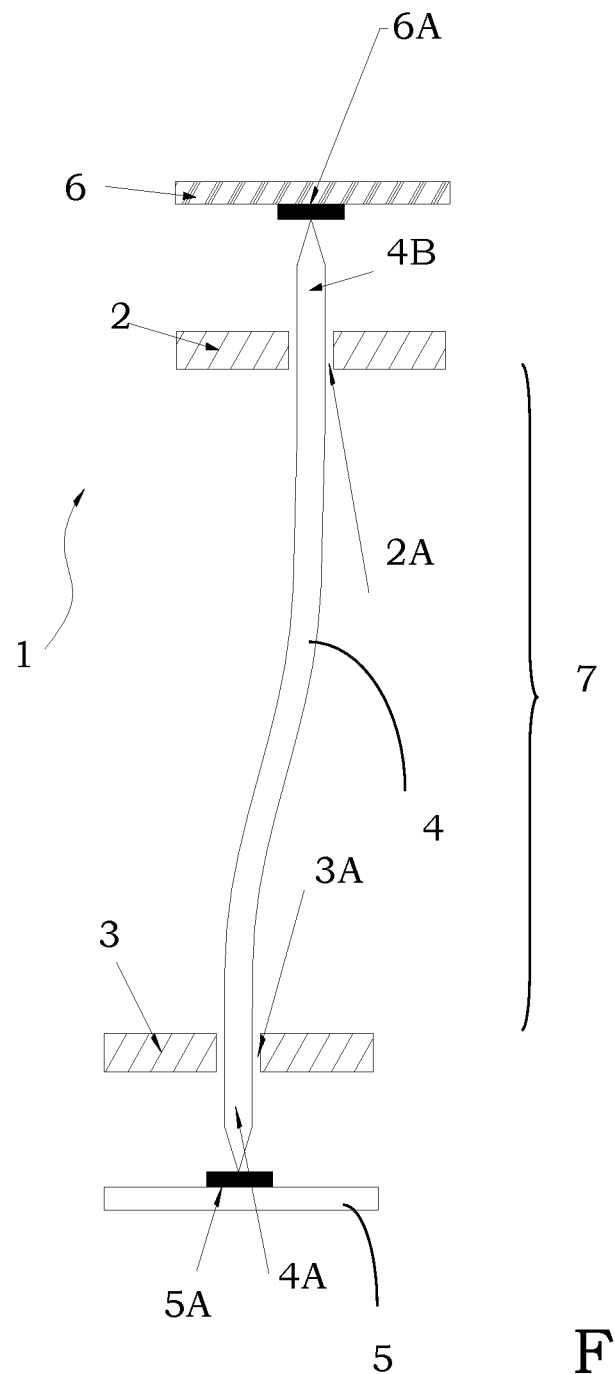
FIG. 1 schematically shows a contact probe for testing heads realized according the prior art.
Figure 2A:
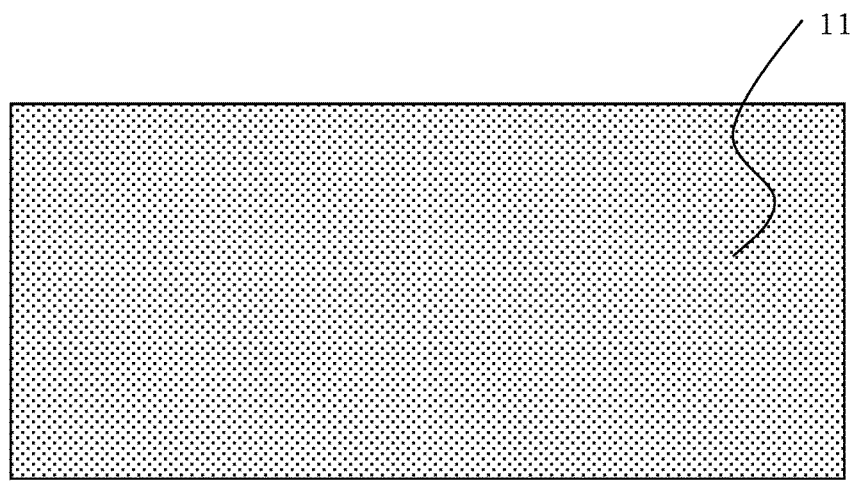
FIGS. 2A-2C schematically show different steps of the manufacturing method according to the disclosure.
Figure 2B:
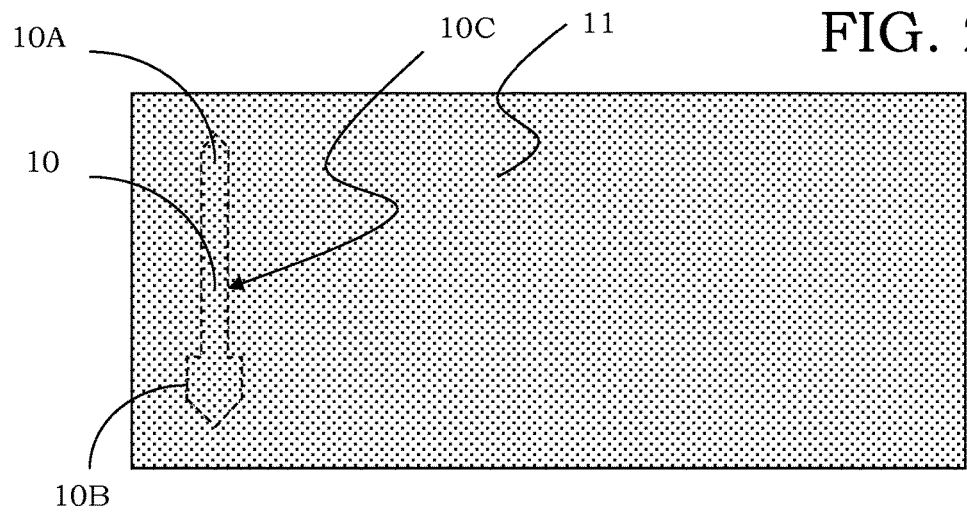
Figure 2C:
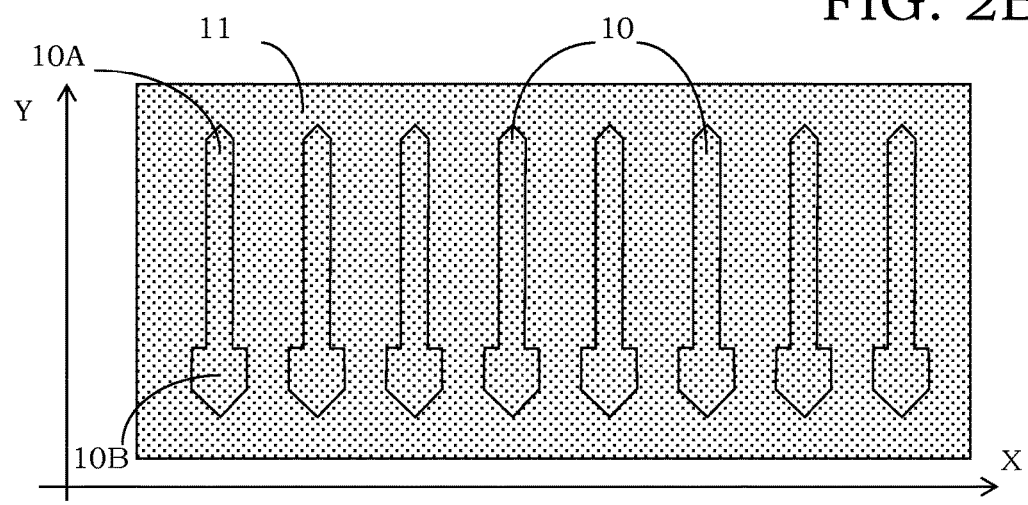

With reference to those figures, and in particular to FIGS. 2A-2C, a manufacturing method of a plurality of contact probes for a testing head is described, each contact probe being globally indicated with 10.

It should be noted that the figures represent schematic views and they are not drawn at scale, but instead are drawn so as to emphasize the important characteristics of the disclosure. Moreover, the method steps described in the following do not form a complete process flow for the manufacturing of the contact probes. The present disclosure can be implemented together with manufacturing techniques currently used in the field, and only those commonly used process steps that are necessary for the understanding of the present disclosure are included.

In particular, the manufacturing method according to the present disclosure includes the steps of:

provinding a substrate 11 made of a conductive material, as shown in FIG. 2A; and defining each contact probe 10 by means of laser cutting according to a desired contour 10C for that probe, as shown by dotted lines in FIG. 2B.

In particular, as shown in FIG. 2C, the method provides the definition by means of laser cutting of a plurality of contact probes 10 in the substrate 11, each probe being provided with respective end portions 10A and 10B, meaning portions including a contact tip 10A or a contact head 10B of the contact probe 10, and extending according to a longitudinal direction of the substrate 11, in particular a vertical direction Y as shown in FIG. 2C.

In the shown example, those contact probes 10 are made in the substrate 11, the probes having corresponding end portions, namely the respective contact tips 10A and the respective contact heads 10B, being side-by-side according to a transversal direction of the substrate 11, in particular a horizontal direction X as shown in FIG. 2C. It is also possible to realize those contact probes 10 so that contact tips 10A and contact heads 10B alternate along that horizontal direction X. Moreover, it should be underlined that the shape, which is shown in the figures, of contact tips 10A and contact heads 10B is absolutely arbitrary, the probes also being able to have the same shape or shapes different than the depicted ones.

Figure 3A:
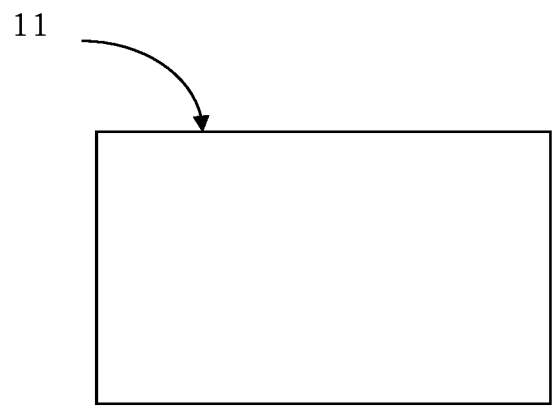
FIGS. 3A-3C schematically show alternative embodiments of a substrate used in the method according to the disclosure.
Figure 3B:
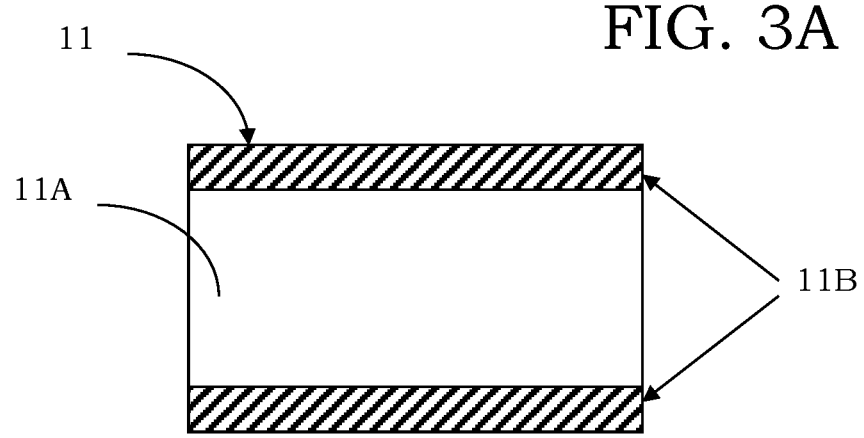
Figure 3C:
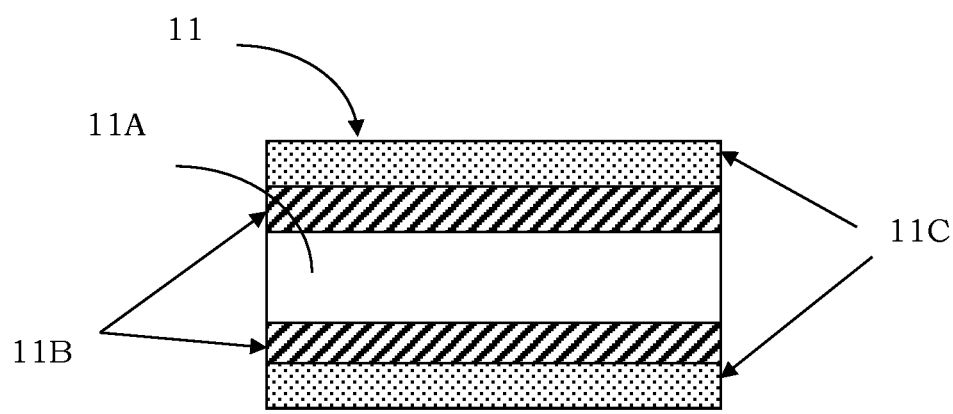

Suitably, as shown in the FIGS. 3A-3C, the substrate 11 is made of a conductive monolayer or multilayer material adapted to realize contact probes for a testing head for electronic devices.

For example, the substrate 11 can be a monolayer made of a metal or a metal alloy selected from nickel or an alloy thereof, such as the nickel-manganese, nickel-cobalt, nickel-iron, nickel-beryllium alloys or tungsten or an alloy thereof, such as tungsten-copper, tungsten-rhenium, or copper or an alloy thereof, such as copper-beryllium, copper-silver, copper-niobium, or rhodium or an alloy thereof, such as rhodium-ruthenium, or iridium or an alloy thereof or yet made of a semiconductor material, such as silicon.

In particular, that conductive material is selected so as to have electrical resistivity values less than 20 μΩ/cm.

Alternatively, the substrate 11 can be a conductive multilayer and in particular can include at least one central layer or core 11A coated by one or more coating layers, for example a first coating layer 11B and a second coating layer 11C, adapted to improve the electrical-mechanical performances and/or the performances in terms of hardness of the contact probes realized starting from that multilayer substrate 11, as shown in the FIGS. 3B and 3C.

In particular, the core 11A can be made of a metal or a metal alloy selected from the ones mentioned above for a monolayer substrate 11 and can be coated by one or more coating layers made of a conductive material having high conductivity values selected from copper, silver, palladium or alloys thereof or made of graphene and/or made of a conductive material having high hardness values selected from rhodium, ruthenium, nickel-phosphor, nickel-palladium, palladium and alloys thereof, or made of graphene, or yet made of doped or non-doped DLC ("Diamond Like Carbon").

Figure 4A:
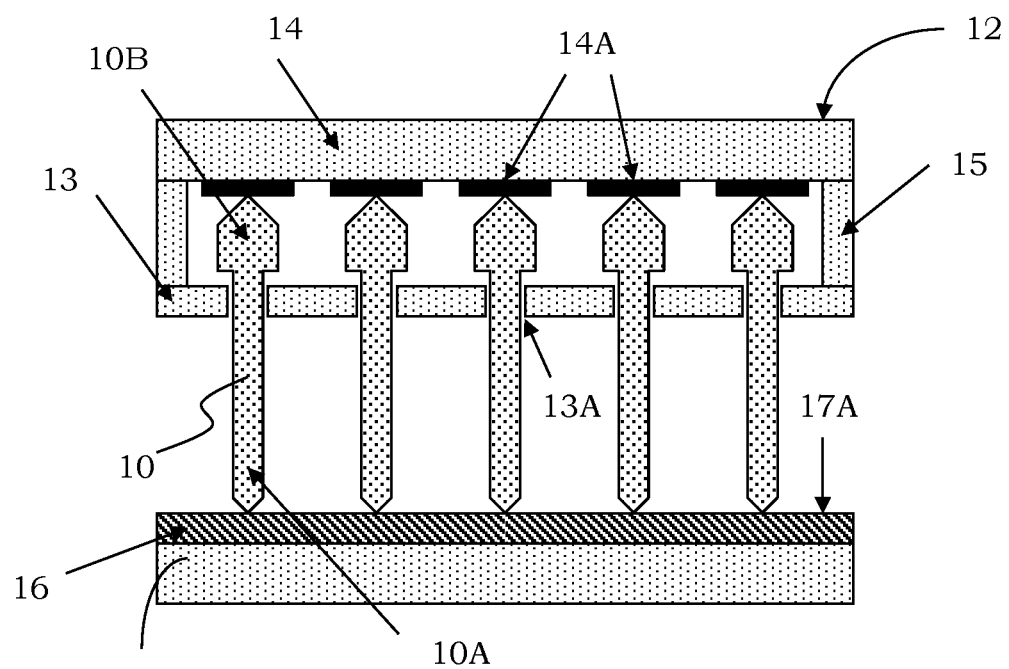
FIGS. 4A-4B and 5A-5B schematically show further steps of the manufacturing method according to the disclosure according to different embodiments thereof.
Figure 4B:
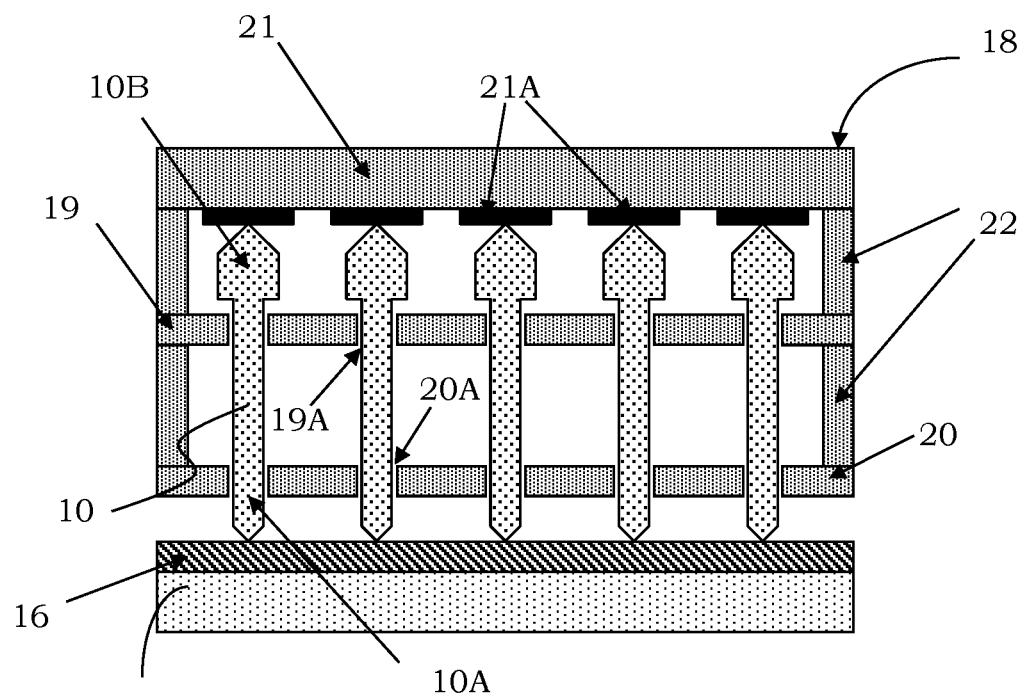

Advantageously according to the present disclosure, as shown in the FIGS. 4A and 4B, the manufacturing method of contact probes further includes a fine definition step of at least one end portion, in the example a contact tip 10A of those contact probes 10, that fine definition step following the step of defining those probes by means of laser cutting. The fine definition step alternatively can affect the contact heads 10B of the contact probes 10.

It should be underlined that the term "fine definition" means a step apt to define the geometrical and dimensional characteristics of the probe end portion with a micrometric precision, at least, that is with a precision greater than the one currently available by using laser definition methods.

In particular, the fine definition step defines the geometrical and dimensional characteristics of the end portions of the contact probes 10 with a precision less than 10 μm, preferably a precision of ±5 μm, more preferably of ±2 μm.

It should also be underlined that the fine definition step is a post processing step, that follows the step of defining the contact probes 10 by laser cutting, that fine definition step not involving a laser processing.

Suitably, according to the present disclosure, that fine definition step is carried out at the same time on the plurality of contact probes 10 realized in the substrate 11 by the step of defining by means of laser cutting.

In particular, it is possible to assemble those contact probes 10 on a processing frame 12 that allows the displacement and manipulation thereof as a group. Such a processing frame 12 essentially includes a plate or plate-shaped guide 13, having a plurality of guide holes 13A inside which the contact probes 10 slide, similarly to what happens in the final testing head where the contact probes 10 are intended to be assembled.

Again similarly to the configuration of a traditional testing head, the processing frame 12 further comprises a space transformer 14, provided with a plurality of contact pads 14A on which the end portions of the contact probes 10 are abutting, in the example the contact heads 10B. The processing frame 12 is then completed by suitable spacers 15, in particular stiff elements extending between the guide 13 and the space transformer 14 so as to make them integral to each other (solidarize them) in a stiff and crushproof manner, still allowing the movement of the probes in the guide holes 13A as well as their bending outside the processing frame 12, in particular below the guide 13, considering the local reference system of FIG. 4A.

In a preferred embodiment, the fine definition step of at least one end portion, in particular, as in the examples shown in the figures, of the contact tips 10A of the contact probes 10 includes a micromechanical definition step by means of pressing contact (touch) on an abrasive cloth.

In particular, as shown in FIG. 4A, the contact probes 10 assembled on the processing frame 12 are pressed on an abrasive cloth 16, suitably supported by a support 17, at their contact tips 10A. It is clearly possible to proceed similarly for the contact heads 10B, by assembling the contact probes 10 180° vertically rotated in the processing frame 12, i.e. with the contact tips 10A in pressing contact on the pads 14A of the space transformer 14.

More in particular, the pressing contact on the abrasive cloth 16 involves the penetration of the end portion of the contact probe 10 inside the thickness of that abrasive cloth 16 contacting also the lateral surfaces of that end portion.

Therefore, the pressing contact on the abrasive cloth 16 can cause a desired re-shape of the corresponding end portion, contact tip 10A or contact head 10B, in particular realizing the fine geometrical and dimensional definition of that end portion.

In a preferred embodiment of the disclosure, the pressing contact on the abrasive cloth 16 realizes a substantial sharpening of that end portion. It is clearly possible to use that pressing contact on the abrasive cloth 16 also to clean the end portions, removing possible burrs or imperfections thereon. Further, the pressing contact on the abrasive cloth 16 can be used to remove possible burrs or imperfections on the end portions without necessarily changing their shape so that it becomes sharpened.

Advantageously according to the present disclosure, the fine definition step can be preceded by assembling the contact probes 10 on a real testing head for which they are intended, globally indicated with 18 in FIG. 4B; in that case too, the assembly in the testing head 18 allows the displacement and manipulation of the contact probes 10 as a group.

More in particular, the testing head 18 includes at least one upper plate or guide 19 and one lower plate or guide 20, having respective upper guide holes 19A and lower guide holes 20A inside which each contact probe 10 slides.

The testing head 18 also comprises a space transformer 21, provided with a plurality of contact pads 21A on which end portions of the contact probes 10 are abutting, in particular the contact heads 10B, and it is completed by suitable spacers 22, in particular stiff elements extending between the upper 19 and lower 20 guides, respectively, as well as between the upper guide 19 and the space transformer 21 in order to make all these elements integral to each other in a stiff and crushproof manner, still allowing the movement of the probes in the respective guide holes 19A and 20A as well as their bending, in particular in the so-called bending zone or air gap between the upper and lower guides 19 and 21.

In that case too, the contact probes 10 suitably housed in the testing head 18 can be subjected to the fine definition step of at least one end portion thereof, in particular the contact tip 10A or the contact head 10B of the contact probe 10.

More in particular, in the shown example in FIG. 4B, the contact tips 10A of the testing head 18 are subjected to a micromechanical definition step by means of pressing contact (touch) on an abrasive cloth 16, which is suitably supported by a support 17, as previously shown, the pressing contact on that abrasive cloth 16 causing the desired re-shape of the end portion affected by that fine definition step.

Figure 5A:
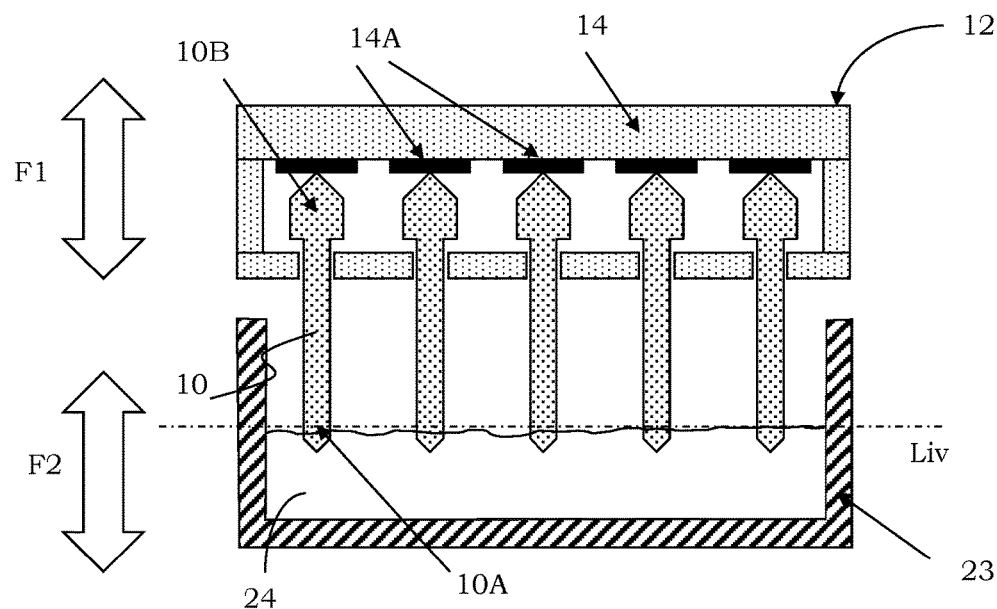
Figure 5B:
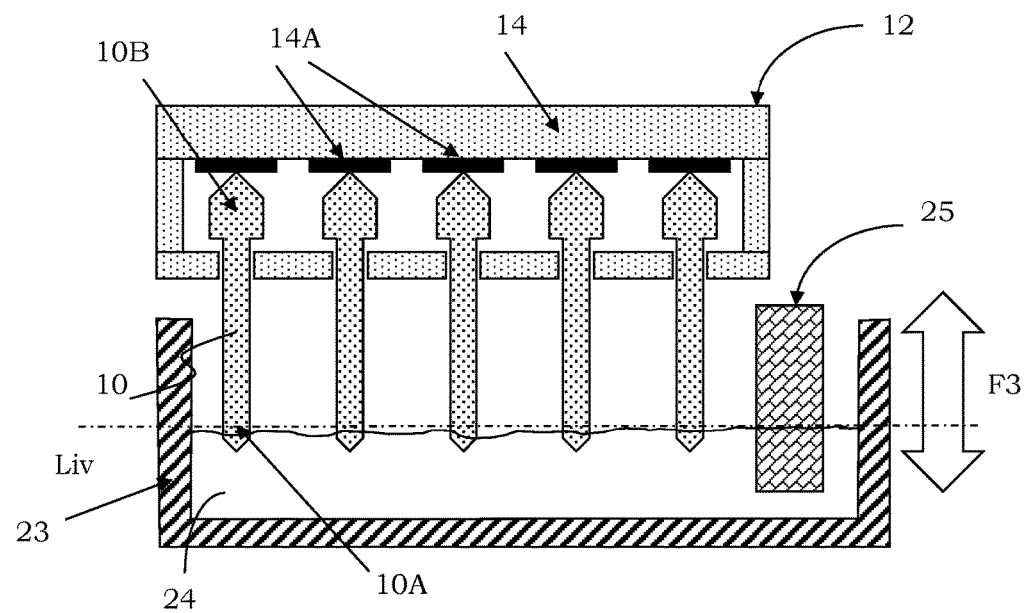

It is equally possible to realize the fine definition step of end portions of the contact probes 10 by means of a chemical or electrochemical process, as schematically shown in the FIGS. 5A and 5B.

In that case, the end portions of the contact probes 10 are immersed in a bath 23 including a chemical agent 24 up to a proper level Liv, as schematically shown in the FIGS. 5A and 5B in case of contact probes 10 assembled on a processing frame 12, with contact tips 10A immersed in the chemical agent 24, the chemical agent 24 being able to etch the contact tips 10A and realize the desired fine definition step. Similar considerations hold in case the contact probes 10 have been assembled on the final testing head 18.

Suitably, the penetration level in the chemical agent 24 of the end portion of each contact probe 10 affected by the fine definition step is varied in order to obtain the desired shape for that portion, for example for the contact tip 10A.

For that purpose, it is possible to provide the processing frame 12 or the bath 23 with suitable driving means, so as to allow a displacement of the contact probes 10 fastened to the processing frame 12 in a direction orthogonal to the level Liv of the chemical agent 24, as shown by the arrows F1 and F2 of FIG. 5A.

Alternatively, it is possible to provide the bath 23 with an oscillating mass 25, whose penetration degree in the chemical agent 24 sets the variation of the level Liv, and thus the penetration level of the end portion of each contact probe 10 in that chemical agent 24, as shown by the arrow F3 of FIG. 5B.

It is also possible to provide bulkhead mechanisms for the bath 23, for example arranged at a bottom of that bath and apt to go up and down, so as to respectively reduce and increase the volume available to the chemical agent 24 and thus vary its level Liv; in that case too, the movement of the bulkhead mechanisms allows obtaining the desired variation of the penetration level of the end portion of each contact probe 10 in that chemical agent 24.

In particular, the bath 23 can include, as chemical agent 24, an acid compound able to carry out a selective etching of the end portion of each contact probe 10 immersed thereinto, in case with a simultaneous passage of current.

Figure 6A:
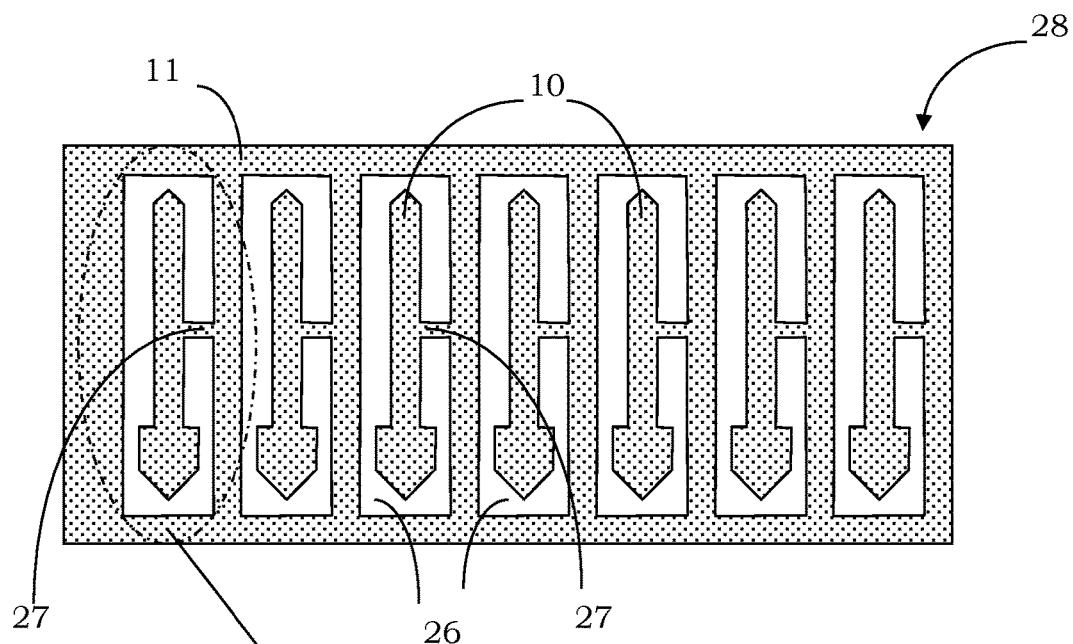
FIGS. 6A-6B and 7A-7B schematically show alternative embodiments of a semi-finished product including a plurality of contact probes realized according to the present disclosure and corresponding details related to a single probe, respectively.

According to an alternative embodiment of the method according to the disclosure, the step of defining the contact probes by means of laser cutting realizes each contact probe 10 in a suitable recess substantially frame-shaped, indicated simply as frame 26, obtained in the substrate 11 by removing material and apt to surround the contact probe 10, as schematically shown in FIG. 6A.

Advantageously according to the present disclosure, the step of defining realizes each contact probe 10 so as to be anchored to the substrate 11 by means of at least one corresponding material bridge 27, thus realizing a semi-finished product 28 including a plurality of contact probes 10 anchored to the substrate 11 by respective material bridges 27.

The method then includes a further separation step of the contact probes 10 from the substrate 11 by means of breaking the material bridges 27.

Figure 6B:
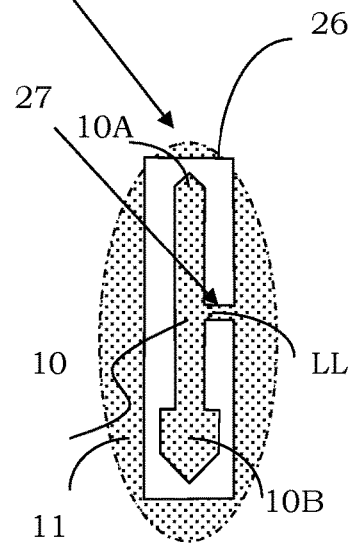

In particular, in the shown example in the FIGS. 6A and 6B, each contact probe 10 has only one material bridge 27 connecting and holding it to the substrate 11 inside the corresponding frame 26, that material bridge 27 being realized at a probe portion, which portion, in a preferred embodiment, is different from an end portion.

Conveniently, as shown in FIG. 6B, the material bridge 27 of each contact probe 10 is provided with at least one weakening line LL passing through it and apt to facilitate separation of the probe from the substrate 11 with breakage of the integrity of the material bridge 27 itself.

In the embodiment shown in the FIGS. 6A and 6B, each material bridge 27 has that weakening line LL being arranged near the contact probe 10, so that the breakage of the weakening line LL when separating the contact probe 10 from the substrate 11 causes a retaining of most of the material bridge 27 anchored to the substrate 11.

Suitably, the weakening lines LL can be obtained by means of a through drilling of the substrate 11 and that drilling can have any shape, for example circular, oval, rectangular, tilted, just to name some of them. Alternatively, the weakening lines LL can be realized by means of a local thinning of the substrate 11 in their correspondence, according to a direction Z orthogonal to the plane of the semi-finished product 28 itself.

It is clearly possible to realize any number of material bridges 27, being arranged also in other points of the contact probe 10 with respect to what shown in the FIGS. 6A and 6B, in a totally random manner.

Figure 7A:
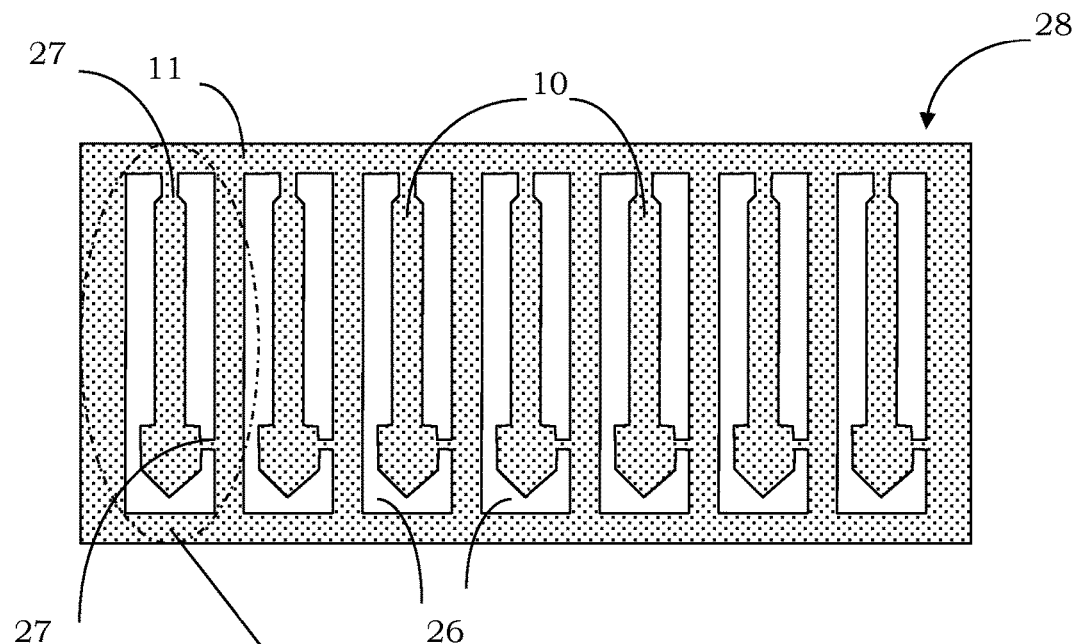
Figure 7B:
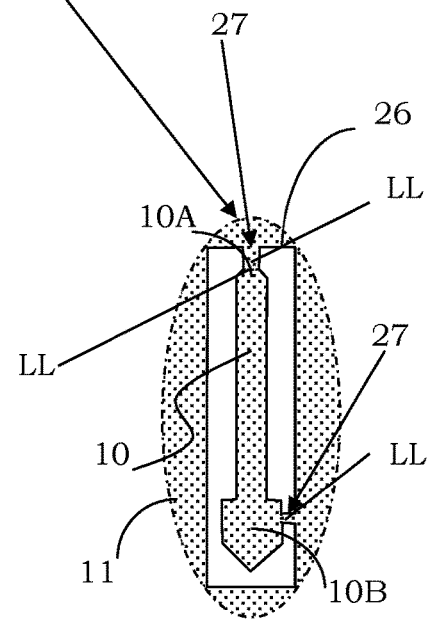

In a preferred embodiment, schematically shown in FIGS. 7A and 7B, each contact probe 10 is realized so as to be anchored to the substrate 11 by only two material bridges 27, one realized at its contact tip 10A in a preferably central position and one realized at its contact head 10B, in a preferably lateral position, as shown in the figures. It is also preferred an embodiment wherein each contact probe 10 is realized so as to be anchored to the substrate 11 by a material bridge 27 realized at its contact tip 10A in a preferably central position and by a pair of further material bridges 27 realized at its contact head 10B, in a preferably lateral position, symmetrically to each other (not shown in the figures).

It should be underlined that the positioning of at least one material bridge 27 on the end portion at the contact tip 10A of the contact probes 10 is particularly advantageous since the following fine definition step of that end portion of the method according to the present disclosure allows eliminating also any imperfections due to the breakage of the weakening lines LL and to the removal of the material bridges 27.

In that way, it is obtained an improvement of the mechanical and electrical operation of the contact probes 10 so obtained, as well as an improved resistance to the corrosion of the end portions so machined.

Moreover, it is expected an improvement of the sliding of the contact probes 10, in particular an improved sliding of the contact tips 10A and of the contact heads 10B of those probes on the respective contact pads of the device under test and of the space transformer, since those end portions do not have roughness anymore after their fine definition step.

It is clearly possible to combine the above-described alternative embodiments, for example providing only one material bridge 27 realized at the contact tips 10A of the contact probes 10 and at least another material bridge 27 or also one pair of material bridges 27 realized in another position, for example in a central position.

Figure 8A:
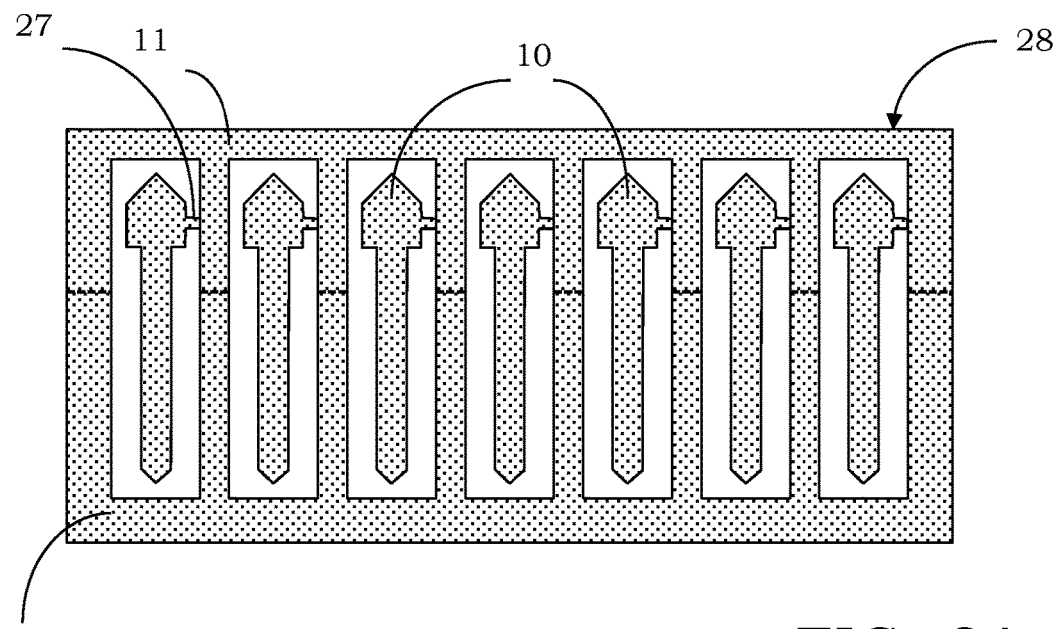
FIGS. 8A-8B schematically show further alternative embodiments of a semi-finished product including a plurality of contact probes realized according to the present disclosure.
Figure 8B:
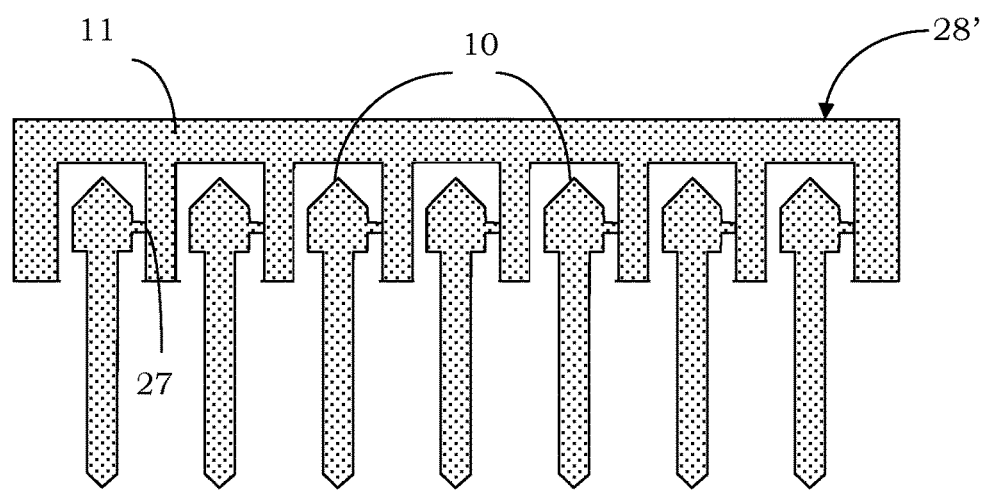

It is also possible provide the portions of the substrate 11 where the contact probes 10 are not realized with a plurality of further weakening lines LL', as schematically shown in FIG. 8A; in particular, the further weakening lines LL' are substantially aligned to each other and they allow removing a portion 11A of the substrate 11 by means of their breakage, so as to allow the respective end portions to emerge, in particular the contact tips 10A of the contact probes 10, as shown schematically in FIG. 8B. In that way, contact probes 10 protruding from the substrate 11 at the contact tips 10A are obtained.

It is also possible to provide that the method according to the present disclosure includes, besides the step of defining that realizes the contact probes 10 so as to be anchored to the substrate 11 by means of respective material bridges 27, a cutting step of the substrate 11 in the portions not belonging to the contact probes 10 and not comprising the material bridges, thus obtaining a semi-finished product 28' that includes a plurality of contact probes 10 anchored to the substrate 11 with the respective end portions emerging, in particular the contact tips 10A, as shown schematically in FIG. 8B.

It should be underlined that the semi-finished product 28' also allows subjecting the contact probes 10 included therein to the fine definition step at the same time, similarly to the probes assembled on a processing frame or on the final testing head, as previously explained. In that case, the fine definition step, for example of the contact tips 10A of the contact probes 10, precedes the separation step of the probes from the substrate 11. Suitable movement means of the semi-finished product 28' will be also provided, in order to realize a pressing contact on an abrasive cloth and/or to immerse the end portions, in particular the contact tips 10A, which protrude from the substrate 11, in a suitable chemical agent 24 of a bath 23, as previously explained.

Further, advantageously according to the present disclosure, the manufacturing method includes a shortening step of the end portions of the contact probes, that shortening step preceding the fine definition step of the contact probes, as schematically shown in the figures from 9A to 9C.

Figure 9A:
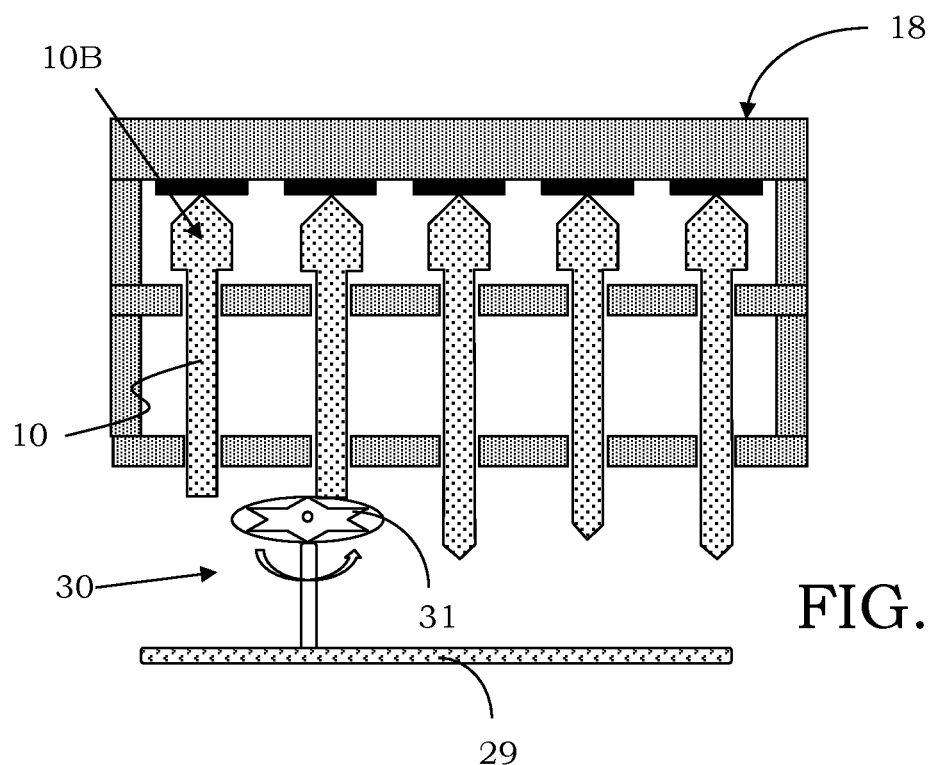
FIGS. 9A-9C schematically show different steps of the planarization method according to the disclosure.

More in particular, in the shown example, the shortening step of the end portions of the contact probes occurs by lapping by means of a suitable lapping system 30. That lapping system 30 essentially includes a rotating saw 31 apt to shorten and lap the end portions of the contact probes 10, the contact tips 10A in the example. The rotating saw 31 is assembled on a track 29, substantially parallel to the guides of the testing head 18 where the contact probes 10 are inserted, as schematically shown in FIG. 9A, that is substantially parallel to a plane of a device under test that should be tested by means of that testing head 18. Other mechanical or chemical cutting methods of metal materials can be considered.

It is also clearly possible to realize that shortening step of the end portions of contact probes 10 wherein those probes are assembled in a processing frame 12.

Figure 9B:
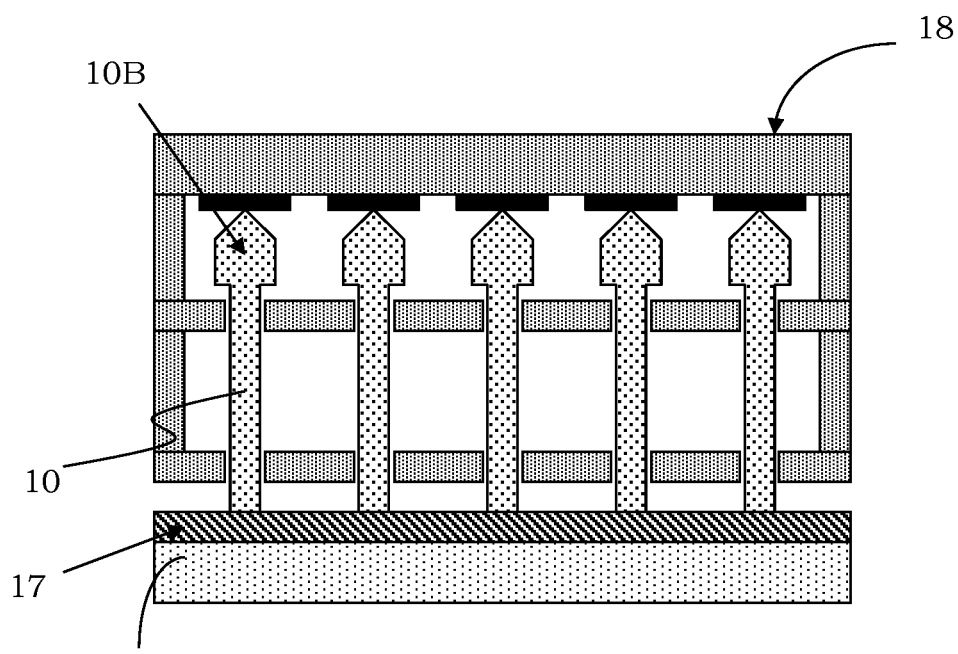

After the end portions of the probes have been shortened by lapping, as previously the method includes a fine definition step of those end portions, as schematically shown in FIG. 9B, in the example a micromechanical definition step by means of pressing contact (touch) on an abrasive cloth 16, supported by a support 17. Similarly, the fine definition step of the end portions can occur by means of a chemical or electrochemical process, as previously explained.

At the end of the fine definition step, the desired re-shape of the end portions, in the example the contact tips 10A, is obtained, all the contact probes having the same length H, meaning the part of the contact probes 10 protruding from the lower guide of the testing head 18, in the direction where the device under test will be placed, namely below in the local reference system of FIG. 9C.

It should be underlined that, advantageously according to the present disclosure, the fine definition step can be used not only to realize the contact probes 10, but also during the life of the testing head 18 where those probes are inserted, to realize again the desired re-shape and/or cleaning of the probe end portions, in that way obtaining a testing head 18 substantially having "consumption" probes, which can be "reconditioned" thanks to the fine definition step of their end portions, in case preceded also by a shortening step.

In the same way, it is possible to repeat the shortening and fine definition steps during the life of the testing head 18 in case of breakage of an end portion of one or more contact probes 10, without necessarily having to replace the broken probe(s).

Figure 9C:
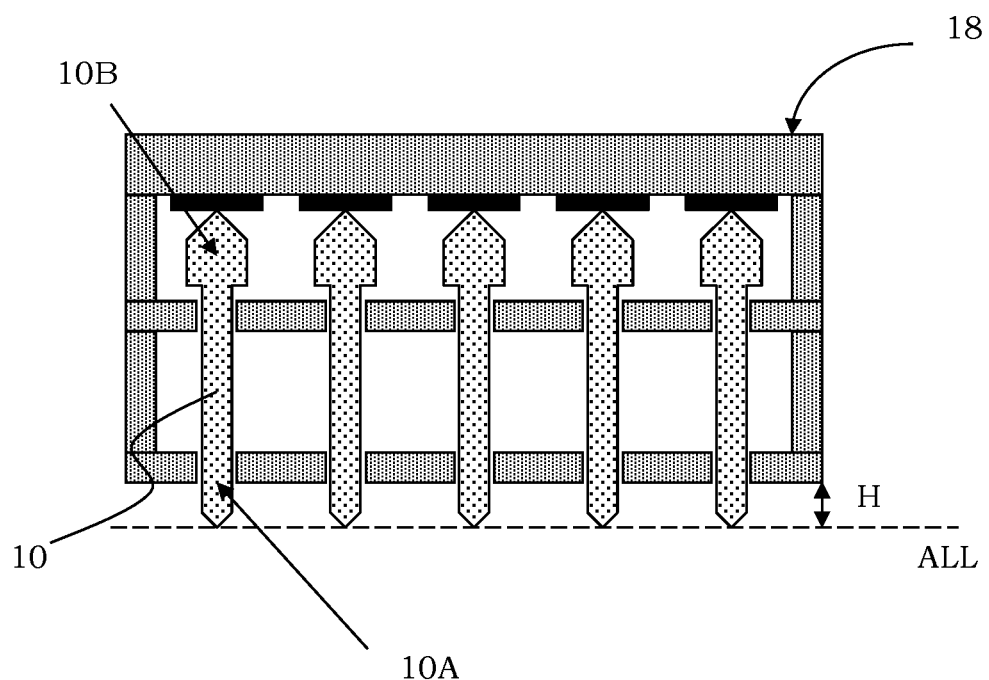

Then, the present disclosure also refers to a planarization method of a testing head, the method being described always referring to the FIGS. 9A-9C.

The planarization method in particular includes the steps of:
  providing a testing head 18 provided with at least one upper guide 19 and one lower guide 20 and including a plurality of contact probes 10, the guides having respective upper guide holes 19A and lower guide holes 20A, each contact probe 10 sliding theretrough;
  shortening at least the end portions of the contact probes 10 which protrude with respect to the lower guide 20 in a plane substantially parallel to a plane of a device under test that should be tested by means of that testing head 18, so as to obtain a desired planarization of the testing head 18 and an alignment of the end portions, as schematically shown in FIG. 9A; and fine defining the end portions of the contact probes 10, as schematically shown in FIG. 9B, obtaining a testing head 18 with contact probes 10 having end portions, in the example the contact tips 10A, all of the same length H and geometrically defined with a micrometric precision, at least, as schematically shown in FIG. 9C.

The term length H of the end portions means the length of the part of the contact probes 10 that protrudes from the lower guide of the testing head 18, in the direction where the device under test will be placed, namely below the lower guide 20 in the local reference system of FIG. 9C.

In that way, a testing head 18 advantageously planarized with respect to a plane of a device under test is obtained.

As previously mentioned, the fine definition step of the end portions of the contact probes 10 can occur by means of micromechanical definition by pressing contact (touch) on abrasive cloth or by means of a chemical or electrochemical process, finally obtaining the desired re-shape and/or cleaning of the end portions, in the example the contact tips 10A.

Moreover, the shortening step of the end portions of the contact probes can occur by lapping by means of a rotating saw 31 assembled on a track 29, which is substantially parallel to the guides of the testing head 18.

Finally, it should be underlined that the planarization method can also involve a testing head 18 already realized, during its life. Clearly, that testing head 18 could be realized by means of any method, also not using a laser cutting of the contact probes 10.

In conclusion, the manufacturing method according to the present disclosure allows obtaining contact probes realized by means of laser cutting and having end portions with geometrical and dimensional characteristics defined with at least a micrometric precision, higher than the precision currently achievable by using laser definition methods.

The fine definition step of the probe end portions is advantageously realized by means of micromechanical definition by pressing contact (touch) on abrasive cloth or by means of a chemical or electrochemical process with immersion in a bath of a chemical agent, a penetration level of the end portion in that bath being varied in order to obtain the desired shape for that portion.

Moreover, the probes can be advantageously obtained starting from monolayer or multilayer materials, in particular conductive or semiconductor materials possibly coated by high conductivity coating layers and/or high hardness coating layers adapted to improve the electrical-mechanical performances of the probes as a whole.

Suitably, the method is also able to carry out a re-shape of the end portions, contact tips or contact heads, of the contact probes obtained in that manner.

In particular, the method allows realizing a substantial sharpening of those end portions and/or a cleaning of those portions, possibly removing burrs or imperfections present thereon.

Moreover, advantageously according to the present disclosure, the method can also include a shortening step of the end portions, the shortening step preceding the fine definition step thereof and being adapted to align those end portions.

Suitably, the fine definition step can be also used during the life of a testing head including a plurality of probes being obtained in that manner, in order to realize again the desired re-shape and/or cleaning of the corresponding end portions, in that way obtaining a testing head having substantially "consumption" probes, which can be "reconditioned" thanks to the fine definition step of their end portions; advantageously, it is possible to repeat the shortening and fine definition steps for example in case of breakage of an end portion of one or more contact probes, without necessarily having to replace the broken probe(s).

It is also verified that, thanks to the method according to the present disclosure, contact probes with end portions having continuous and uniform profiles are obtained, without the undesired section variations and discontinuities which are present in the contact probes that are realized using the known methods.

Finally, advantageously according to the present disclosure, the planarization method allows realizing a testing head including a plurality of contact probes having the end portions all of the same length, i.e. planarized with respect to a plane of a device under test, improving the performed electrical test thanks to the improved contact uniformity.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A manufacturing method of contact probes for a testing head comprising the steps of:
    providing a substrate made of a conductive material;
    laser cutting at least one contact probe in the substrate; and
    at least one post-processing fine definition step that defines at least one end portion of the contact probe, following the step of laser cutting the contact probe, the end portion being a portion including a contact tip or a contact head of the contact probe,
    the post-processing fine definition step being simultaneously carried out on the plurality of contact probes formed in the substrate by the laser cutting step and not involving a laser processing and geometrically defining the end portion of the contact probe with at least a substantially micrometric precision.

2. The manufacturing method of claim 1, further comprising:
    a step of assembling the plurality of contact probes in a processing frame or in a testing head so as to allow displacement and manipulation thereof as a group.

3. The manufacturing method of claim 1, wherein the post-processing fine definition step includes a micromechanical definition step of the end portion of the contact probe.

4. The manufacturing method of claim 3, wherein the micromechanical definition step comprises a pressing contact onto an abrasive cloth of the end portion of the contact probe.

5. The manufacturing method of claim 1, wherein the post-processing fine definition step comprises a chemical or electrochemical process.

6. The manufacturing method of claim 5, wherein the chemical or electrochemical process includes an immersion of the end portion of the contact probe in a chemical agent up to a level, the chemical agent being adapted to etch the end portion of the contact probe.

7. The manufacturing method of claim 1, wherein the post-processing fine definition step comprises a re-shape of the end portion of the contact probe.

8. The manufacturing method of claim 1, wherein the post-processing fine definition step comprises a cleaning of the end portion of the contact probe.

9. The manufacturing method of claim 1, wherein the post-processing fine definition step comprises a re-shape and a cleaning of the end portion of the contact probe.

10. The manufacturing method of claim 1, wherein:
the step of laser cutting realizes each contact probe anchored to the substrate by at least one bridge of material; and the method comprises:
a further step of separation of each contact probe from the substrate by breaking and removing the at least one bridge of material.

11. The manufacturing method of claim 10, wherein the at least one bridge of material is realized in correspondence of an end portion of the contact probe and the post-processing fine definition step of the end portion of the contact probe eliminates any imperfections due to the breakage and removal of the bridge of material.

12. The manufacturing method of claim 10, wherein the post-processing fine definition step is simultaneously carried out on a plurality of contact probes anchored to the substrate prior to the further step of separation of each contact probe from the substrate.

13. The manufacturing method of claim 12, further comprising:
a step of cutting the substrate in portions not belonging to the contact probes and not comprising the at least one bridge of material, the contact probes protruding from the substrate in correspondence of at least one end portion.

14. The manufacturing method of claim 1, further comprising:
a step of shortening the end portion of the contact probe preceding the post-processing fine definition step.

15. The manufacturing method of claim 1, wherein the post-processing fine definition step is repeated for a plurality of contact probes assembled in a testing head during the life thereof.

16. The manufacturing method of claim 15, wherein the post-processing fine definition step is preceded by a step of shortening respective end portions of the contact probes.

17. A planarization method of a testing head provided with at least one upper guide and one lower guide and comprising a plurality of contact probes, the guides having respective upper and lower guide holes, each contact probe sliding therethrough, the planarization method comprising the steps of:
shortening at least one end portion of the contact probes which protrudes with respect to the lower guide in a plane substantially parallel to a plane of a device to be tested by the testing head; and
fine defining the at least one end portion of the contact probes,
the fine defining step being simultaneously carried out on the plurality of contact probes formed in the substrate by the laser cutting step and not involving a laser processing and geometrically defining the end portion of the contact probe with at least a substantially micrometric precision, so obtaining a testing head with contact probes having end portions all of a same length and geometrically defined with at least a substantially micrometric precision.

18. A manufacturing method of contact probes for a testing head comprising the steps of:
providing, a substrate made of a conductive material;
laser cutting a plurality of contact probes in the substrate; and
assembling the plurality of contact probes in a processing frame or in a testing head so as to allow the displacement and manipulation of the contact probes as a group; and
at least one post-processing, fine definition step of at least one end portion of the contact probes, which follows the steps of laser cutting and assembling the contact probes and is simultaneously carried out on the plurality of contact probes,
the at least one end portion being, a portion including a contact tip or a contact head of at least one of the contact probes, and
the post-processing fine definition step being simultaneously carried out onto the plurality of contact probes formed in the substrate by the laser cutting step and not involving a laser processing and further including:
a micromechanical definition step comprising a pressing contact onto an abrasive cloth of the end portion of the contact probes assembled in the processing frame or in the testing head, so geometrically defining the end portion of the contact probe with at least a substantially micrometric precision less than 10 micrometers ($\mu$m).

19. The manufacturing method of claim 18, wherein the post-processing fine definition step comprises a re-shape of the end portion of the contact probe.

20. The manufacturing method of claim 18, wherein the post-processing fine definition step comprises a cleaning of the end portion of the contact probe.

21. The manufacturing method of claim 18, wherein the post-processing fine definition step comprises a re-shape and a cleaning of the end portion of the contact probe.

22. The manufacturing method of claim 18, wherein:
the step of laser cutting realizes each contact probe anchored to the substrate by at least one bridge of material,
the method further comprising
a step of separation of each contact probe from the substrate by breaking and removing the at least one bridge of material.

23. The manufacturing method of claim 22, wherein:
the at least one bridge of material is realized in correspondence of an end portion of the at least one contact probe, and
the post-processing fine definition step of the end portion eliminates any imperfections due to the breakage and removal of the at least one bridge of material.

24. The manufacturing method of claim 22, wherein the post-processing fine definition step is simultaneously carried out on a plurality of the contact probes anchored to the substrate prior to the step of separation of each contact probe from the substrate.

25. The manufacturing method of claim 24, further comprising:
a step of cutting the substrate in portions not belonging to the contact probes and not comprising the bridges of material, the contact probes protruding from the substrate in correspondence of at least one end portion.

26. The manufacturing method of claim 18, further comprising:
a step of shortening the at least one end portion of the at least one contact probe preceding the post-processing fine definition step.

27. The manufacturing method of claim 18, wherein the post-processing fine definition step is repeated for a plurality of the contact probes assembled in a testing head during the life thereof.

28. The manufacturing method of claim 27, wherein the post-processing fine definition step is preceded by a step of shortening respective end portions of the contact probes.

* * * * *

UNITED STATES PATENT AND TRADEMARK OFFICE
CERTIFICATE OF CORRECTION

PATENT NO.         : 10,401,387 B2
APPLICATION NO.    : 15/640159
DATED              : September 3, 2019
INVENTOR(S)        : Raffaele Ubaldo Vallauri Page 1 of 1

It is certified that error appears in the above-identified patent and that said Letters Patent is hereby corrected as shown below:

In the Claims

Column 16, Claim 18, Line 10:
"providing, a substrate" should be --providing a substrate--.

Column 16, Claim 18, Line 17:
"post-processing, fine definition" should be --post-processing fine definition--.

Column 16, Claim 18, Line 22:
"end portion being, a portion" should be --end portion being a portion--.

Signed and Sealed this
Seventh Day of April, 2020

Andrei Iancu
*Director of the United States Patent and Trademark Office*